(12) United States Patent
Tang et al.

(10) Patent No.: US 11,177,437 B2
(45) Date of Patent: Nov. 16, 2021

(54) ALIGNMENT THROUGH TOPOGRAPHY ON INTERMEDIATE COMPONENT FOR MEMORY DEVICE PATTERNING

(71) Applicant: International Business Machines Corporation, Armonk, NY (US)

(72) Inventors: Hao Tang, Slingerlands, NY (US); Michael Rizzolo, Delmar, NY (US); Injo Ok, Loudonville, NY (US); Theodorus E. Standaert, Clifton Park, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/684,672

(22) Filed: Nov. 15, 2019

(65) Prior Publication Data

US 2020/0083447 A1    Mar. 12, 2020

Related U.S. Application Data

(62) Division of application No. 16/019,798, filed on Jun. 27, 2018, now Pat. No. 10,658,589.

(51) Int. Cl.
  *H01L 45/00* (2006.01)
  *H01L 23/544* (2006.01)
  *H01L 27/24* (2006.01)
(52) U.S. Cl.
  CPC ............ *H01L 45/16* (2013.01); *H01L 23/544* (2013.01); *H01L 27/2463* (2013.01); *H01L 45/1253* (2013.01); *H01L 2223/54426* (2013.01)

(58) Field of Classification Search
  None
  See application file for complete search history.

(56) References Cited

U.S. PATENT DOCUMENTS 4,517,217 A    5/1985  Hoffman
6,452,204 B1   9/2002  Ishiwata et al.
(Continued)

OTHER PUBLICATIONS

Tang, Hao, et al., "Alignment Through Topography on Intermediate Component for Memory Device Patterning", U.S. Appl. No. 16/019,798, filed Jun. 27, 2018.

(Continued)

*Primary Examiner* — David E Graybill
(74) *Attorney, Agent, or Firm* — Cantor Colburn LLP; Randall Bluestone (57) ABSTRACT

An intermediate semiconductor device structure includes a first area including a memory stack area and a second area including an alignment mark area. The intermediate structure includes a metal interconnect arranged on a substrate in the first area and a first electrode layer arranged on the metal interconnect in the first area, and in the second area. The intermediate structure includes an alignment assisting marker arranged in the second area. The intermediate structure includes a dielectric layer and a second electrode layer arranged on the alignment assisting marker in the second area and on the metal interconnect in the first area. The intermediate structure includes a hard mask layer arranged on the second electrode area. The hard mask layer provides a raised area of topography over the alignment assisting marker. The intermediate structure includes a resist arranged on the hard mask layer in the first area.

10 Claims, 12 Drawing Sheets

(56) References Cited

U.S. PATENT DOCUMENTS

| | | | |
|---|---|---|---|
| 6,858,441 B2 | 2/2005 | Nuetzel et al. | |
| 6,933,204 B2 | 8/2005 | Sarma et al. | |
| 6,979,526 B2 | 12/2005 | Ning | |
| 7,115,527 B2 | 10/2006 | Shea | |
| 7,223,612 B2 | 5/2007 | Sarma | |
| 7,241,668 B2 | 7/2007 | Gaidis | |
| 7,276,455 B2 | 10/2007 | Shea | |
| 7,442,624 B2 | 10/2008 | Sarma et al. | |
| 7,476,954 B2 | 1/2009 | Wang et al. | |
| 7,494,825 B2 | 2/2009 | Butcher et al. | |
| 7,507,633 B2 | 3/2009 | Kanakasabapathy et al. | |
| 7,534,695 B2 * | 5/2009 | Suzuki | G03F 9/7076 257/68 |
| 7,678,646 B2 * | 3/2010 | Itoh | H01L 27/11509 438/254 |
| 7,785,980 B2 * | 8/2010 | Suzuki | G03F 9/7076 438/401 |
| 7,825,000 B2 | 11/2010 | Kanakasabapathy et al. | |
| 7,829,963 B2 | 11/2010 | Wang et al. | |
| 8,420,408 B2 | 4/2013 | Lee et al. | |
| 8,440,389 B2 * | 5/2013 | Pollard | C11D 7/5004 430/329 |
| 8,877,522 B2 | 11/2014 | Nagel et al. | |
| 8,907,435 B2 | 12/2014 | Lee et al. | |
| 8,963,114 B2 * | 2/2015 | Liao | H01L 45/1233 257/2 |
| 9,172,036 B2 * | 10/2015 | Chen | H01L 45/122 |
| 9,397,139 B1 * | 7/2016 | Tan | H01L 28/10 |
| 9,553,129 B2 * | 1/2017 | Jiang | H01L 23/544 |
| 9,653,682 B1 | 5/2017 | Chou et al. | |
| 9,768,231 B2 * | 9/2017 | Tran | H01L 27/2463 |
| 9,773,552 B2 * | 9/2017 | Shih | G11C 13/0069 |
| 9,876,169 B2 * | 1/2018 | Sung | H01L 45/1233 |
| 9,972,775 B2 * | 5/2018 | Shum | H01L 43/08 |
| 10,003,022 B2 * | 6/2018 | Liu | H01L 45/1675 |
| 10,121,964 B2 * | 11/2018 | Tan | H01L 43/08 |
| 10,269,885 B2 * | 4/2019 | Murai | H01L 27/3262 |
| 10,381,563 B1 | 8/2019 | Ando et al. | |
| 10,475,999 B2 * | 11/2019 | Chang | H01L 45/1675 |
| 10,658,589 B2 * | 5/2020 | Tang | H01L 27/2463 |
| 10,672,984 B2 * | 6/2020 | Ando | G06N 3/0635 |
| 10,833,266 B2 * | 11/2020 | Ando | H01L 45/1675 |
| 2002/0164828 A1 | 11/2002 | Ishiwata et al. | |
| 2002/0192926 A1 | 12/2002 | Schroeder et al. | |
| 2003/0224260 A1 | 12/2003 | Ning | |
| 2004/0043579 A1 | 3/2004 | Nuetzel | |
| 2005/0079683 A1 | 4/2005 | Sarma | |
| 2006/0011587 A1 | 1/2006 | Shea | |
| 2006/0017180 A1 | 1/2006 | Sarma | |
| 2006/0024923 A1 | 2/2006 | Sarma et al. | |
| 2006/0141737 A1 | 6/2006 | Gaidis | |
| 2006/0283837 A1 | 12/2006 | Shea | |
| 2007/0032015 A1 * | 2/2007 | Itoh | H01L 27/11509 438/250 |
| 2007/0210394 A1 | 9/2007 | Kanakasabapathy | |
| 2007/0275520 A1 * | 11/2007 | Suzuki | H01L 27/10891 438/197 |
| 2008/0038897 A1 * | 2/2008 | Suzuki | G03F 9/708 438/401 |
| 2008/0160640 A1 | 7/2008 | Butcher | |
| 2008/0171223 A1 | 7/2008 | Wang et al. | |
| 2008/0253039 A1 | 10/2008 | Nagamine et al. | |
| 2009/0059656 A1 | 3/2009 | Kanakasabapathy | |
| 2009/0194833 A1 | 8/2009 | Wang et al. | |
| 2011/0254114 A1 | 10/2011 | Nagamine et al. | |
| 2012/0018826 A1 | 1/2012 | Lee et al. | |
| 2013/0221462 A1 | 8/2013 | Lee et al. | |
| 2014/0252295 A1 * | 9/2014 | Liao | H01L 27/2463 257/2 |
| 2014/0287536 A1 | 9/2014 | Nagel | |
| 2015/0091110 A1 | 4/2015 | Kuo et al. | |
| 2015/0144859 A1 * | 5/2015 | Chen | H01L 45/12 257/4 |
| 2015/0255718 A1 * | 9/2015 | Liu | H01L 27/2436 257/4 |
| 2016/0093670 A1 | 3/2016 | Jiang et al. | |
| 2016/0268336 A1 | 9/2016 | Shum | |
| 2016/0365512 A1 * | 12/2016 | Sung | H01L 45/147 |
| 2017/0084820 A1 * | 3/2017 | Tan | H01L 43/08 |
| 2017/0140820 A1 * | 5/2017 | Shih | H01L 27/2427 |
| 2017/0236869 A1 * | 8/2017 | Tran | H01L 27/2463 257/4 |
| 2017/0271423 A1 | 9/2017 | Murai et al. | |
| 2018/0097177 A1 * | 4/2018 | Chang | H01L 45/12 |
| 2018/0145253 A1 * | 5/2018 | Zhou | H01L 45/16 |
| 2020/0006655 A1 * | 1/2020 | Tang | H01L 23/544 |
| 2020/0028080 A1 * | 1/2020 | Ando | H01L 45/1675 |
| 2020/0111958 A1 * | 4/2020 | Ando | H01L 45/04 |

OTHER PUBLICATIONS

List of IBM Patents or Patent Applications Treated as Related; (Appendix P), Filed Nov. 14, 2019, 2 pages.

* cited by examiner

ALIGNMENT THROUGH TOPOGRAPHY ON INTERMEDIATE COMPONENT FOR MEMORY DEVICE PATTERNING

DOMESTIC PRIORITY

This application is a divisional of U.S. patent application Ser. No. 16/019,798, filed Jun. 27, 2018, the disclosure of which is incorporated by reference herein in its entirety.

BACKGROUND

The present invention generally relates to fabrication methods and resulting structures for semiconductor devices. More specifically, the present invention relates to alignment through topography on an intermediate component for memory device patterning.

Integrated circuit chips are fabricated one level at a time. The levels include, for example, diffusions, gates, metal lines, insulation, isolation, and contacts. The structures on these levels must be precisely positioned so that the finished chip has properly positioned structures. The step of positioning a level with respect to a previously formed level is called alignment.

Alignment of patterned materials involves manual or automatic selection of alignment targets. The alignment targets typically include "alignment marks" that a recognition system uses to learn a position of the part or material subject to examination. A user or computer then provides a region of interest (ROI) by moving to the selected location, while the software records this coordinate. Alternatively, a coordinate relative to some known reference point (e.g., center of the part) is indicated by the software. Once the setup is completed (i.e., after the alignment marks are recorded), the optical system aligns and moves to a ROI on the part for measurement or inspection.

SUMMARY

Embodiments of the present invention are directed to a method for fabricating a semiconductor device. A non-limiting example of the method includes forming a conductive interconnect in a first area of the semiconductor device. The method further includes depositing a first electrode layer on the conductive interconnect. The method includes forming an alignment assisting marker in a second area of the semiconductor device. The method includes depositing a dielectric layer and a second electrode layer on the alignment assisting marker in the second area and on the conductive interconnect in the first area. The method further includes depositing a hard mask layer on the dielectric layer and the second electrode layer to create a raised area of topography over the alignment assisting marker. The method includes depositing and patterning a resist on the hard mask layer, using the raised area of topography created by the hard mask layer over the alignment assisting marker to align the resist over the conductive interconnect in the first area of the semiconductor device. The method includes etching to form a memory stack over the conductive interconnect by transferring the pattern of the resist into the first electrode layer, the dielectric layer, and the second electrode layer in the first area of the semiconductor device.

Another non-limiting example of the method includes forming a metal interconnect in a first area of the semiconductor device. The method includes depositing a first electrode layer on the metal interconnect. The method further includes depositing and patterning a film on the first electrode layer to form an alignment assisting marker is a second area of the semiconductor device proximate to the first area. The method includes depositing a dielectric layer and a second electrode layer on the alignment assisting marker in the second area and on the metal interconnect in the first area. The method includes depositing a metal connector layer on the second electrode layer. The method further includes depositing a hard mask layer on the metal connector layer to create a raised area of topography over the alignment assisting marker. The method includes depositing and patterning a resist on the hard mask layer, using the raised area of topography created by the hard mask layer over the alignment assisting marker to align the resist over the metal interconnect in the first area of the semiconductor device. The method further includes etching to form a memory stack over the metal interconnect by transferring the pattern of the resist into the first electrode layer, the dielectric layer, and the second electrode layer in the first area of the semiconductor device.

Embodiments of the invention are directed to an intermediate semiconductor device structure. A non-limiting example of the intermediate semiconductor device structure includes a first area including a memory stack area and a second area including an alignment mark area. The intermediate semiconductor device structure includes a metal interconnect arranged on a substrate in the first area and a first electrode layer arranged on the metal interconnect in the first area, and in the second area. The intermediate semiconductor device structure includes an alignment assisting marker arranged in the second area. The intermediate semiconductor device structure includes a dielectric layer and a second electrode layer arranged on the alignment assisting marker in the second area and on the metal interconnect in the first area. The intermediate semiconductor device structure includes a hard mask layer arranged on the second electrode area. The hard mask layer provides a raised area of topography over the alignment assisting marker. The intermediate semiconductor device structure includes a resist arranged on the hard mask layer in the first area.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-12 illustrate a process flow for fabricating a semiconductor device according to embodiments of the invention, in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, photolithography tools have alignment systems for aligning a level to be printed with a level already present on the wafer. The alignment system first determines the location of an alignment target on the wafer that was printed during a previous photolithographic process step. Once the location of the alignment target is established, the system adjusts the location of the wafer so the present level is printed at the proper location with respect to that previous level target. The previous level target can be the first level printed, the last level so far printed, or any level in between.

Alignment systems on photolithography tools are generally designed to work with specific types of alignment marks on the wafer. The alignment system acquires an alignment signal by optically scanning an alignment mark. The alignment signal received from the alignment mark is then analyzed to determine the location of the alignment mark on the wafer. This is repeated for several alignment marks in different exposure fields on the wafer. The data from this group of alignment marks is then processed with a computer in the photolithography tool to determine the location of the wafer.

Alignment systems are used to fabricate a wide array of semiconductor devices, including Resistive Random Access Memory (RRAM) devices. RRAM devices are an emerging non-volatile memory technology with various advantages in terms of cell area, device density, power consumption, programming/erasing speed, three-dimensional integration, multi-value implementation, and the like over FLASH memories. The RRAMs include a vertical arrangement of Metal/Insulator/Metal (MIM). As a result, the RRAMs can achieve high-density storage by means of a crossbar array configuration. In the crossbar array configuration, memory cells are disposed at respective intersections between sets of parallel lines, which are vertically spaced apart and extend in directions perpendicular to each other. Each of the memory cells can be independently selected and subsequently read or written.

As mentioned above, the position of alignment marks are programmed into the tools used to fabricate semiconductor devices, including RRAM devices. If an overlaying material layer is transparent or translucent, the tool can readily locate the alignment marks. However, opaque layers, for example metals (e.g., titanium nitride, ruthenium, platinum, or tantalum nitride used in RRAM devices), block optical signals of the alignment marks, which create difficulties for overlay and alignment during lithography processes.

One method for aligning optically opaque layers is to form recessed alignment marks in an underlying material layer. For example, using an additional mask, the interlayer dielectric surrounding the alignment mark can be recessed to create topography surrounding the alignment mark. When opaque layers are subsequently deposited on the recessed area, the topography is transferred through the opaque layers, so the top surface of the opaque layers above the alignment mark becomes visible. However, recessing the interlayer dielectric can create defects, result in process variation, and/or induce alignment/overlay failure. Further, metal exposure, e.g., copper, can contaminate process tools downstream.

Turning now to an overview of the aspects of the invention, one or more embodiments of the invention address the above-described shortcomings of the prior art by providing fabrication methods and resulting structures for semiconductor devices in which surface topography is created on an intermediate component between the underlying metal layer and the memory stack materials. According to one or more embodiments of the invention, topography is created on a masking layer that is arranged over a non-memory region.

The above-described aspects of the invention address the shortcomings of the prior art by providing fabrication methods and resulting structures for semiconductor devices that form an alignment assisting marker that creates a detectable surface topography on overlying layers that enables successfully guided alignment/overlay through opaque metal and memory stack material layers.

Figure 1:
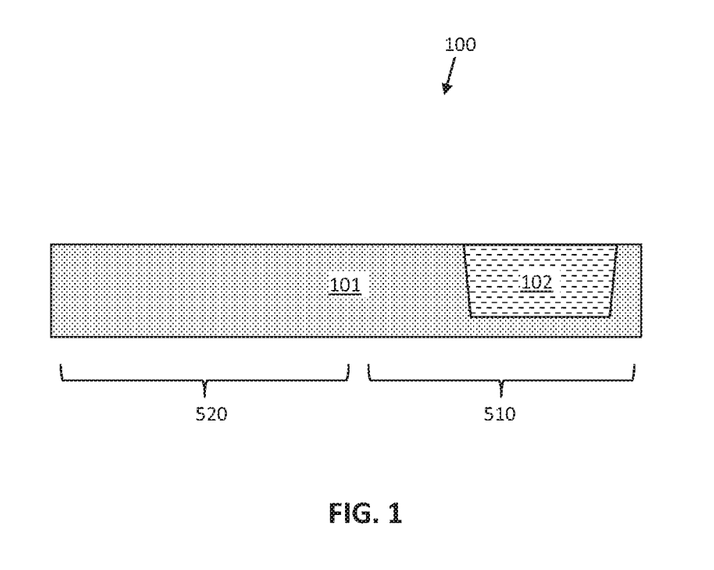
FIG. 1 depicts cross-sectional side view of the semiconductor device including a metal interconnect arranged in a dielectric layer.

Turning now to a more detailed description of aspects of the present invention, FIGS. 1-12 illustrate a process flow for fabricating a semiconductor device according to embodiments of the invention. FIG. 1 depicts cross-sectional side view of the semiconductor device 100 including a metal interconnect 102 arranged in a dielectric layer 101 (also referred to as the substrate). The semiconductor device 100 includes a first area 510, and a second area 520 proximate to the first area 510. The metal interconnect 102 is formed in the first area 510, which is the memory stack area. The second area 520 is the non-memory, alignment assisting area. The memory stack area will include the stack of materials to be etched to form the RRAM stack over the metal interconnect 102. The non-memory, alignment assisting area can be the area in between two dies reserved for dicing or cutting, commonly referred to as scribelanes.

The dielectric layer 101 includes, but is not limited to, a low-k dielectric oxide, for example, silicon dioxide, spin-on-glass, a flowable oxide, a high-density plasma oxide, or any combination thereof. The dielectric layer 101 can be formed by performing deposition process, including, but not limited to chemical vapor deposition (CVD), physical vapor deposition (PVD), plasma enhanced CVD, atomic layer deposition (ALD), evaporation, chemical solution deposition, or like processes.

To form the metal interconnect 102 (also referred to as a conductive interconnect), a trench is etched in the dielectric layer 101. The trench is filled with one or more liner layers, followed by one or more metals. Non-limiting examples of materials for the metal forming the metal interconnect 102 include copper, copper alloys, aluminum, aluminum alloys, tungsten, tungsten silicide, cobalt, molybdenum, titanium nitride, tantalum, tantalum nitride, or any combination thereof. A planarization process, e.g., CMP, is performed to remove excess metal(s) from the surface of the dielectric layer 101.

Figure 2:
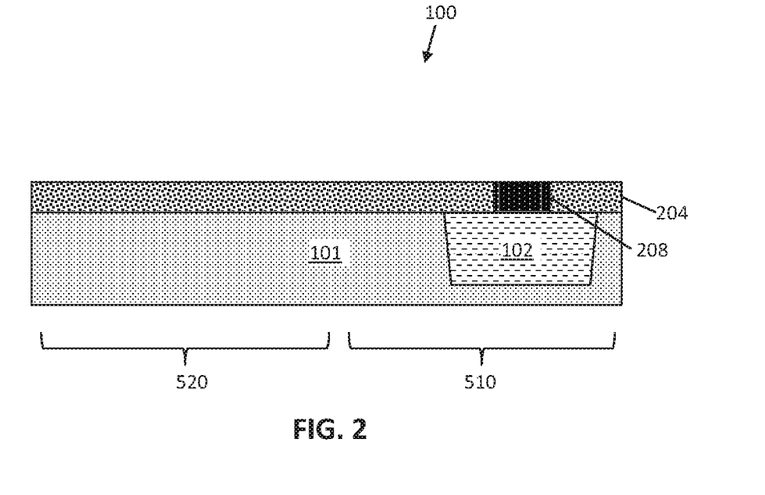
FIG. 2 depicts a cross-sectional side view of the semiconductor device subsequent to forming a metal connector on the metal interconnect.

FIG. 2 depicts a cross-sectional side view of the semiconductor device 100 subsequent to, optionally, forming a metal connector 208 on the metal interconnect 102. The metal connector 208 can be included to prevent metal, e.g., copper, diffusion from the metal interconnect 102 into memory stack. A dielectric layer 204 is deposited on the metal interconnect 102. Lithography and etching are used to form a trench in the dielectric layer 204 over the metal interconnect 102, and one or more metals are deposited in the trench to form the metal connector 208. Non-limiting examples of the dielectric layer 204 include silicon dioxide, silicon nitride, silicon oxynitride, silicon carbonitride, spin-on-glass, or a combination thereof. Non-limiting examples of metals for the metal connector 208 include niobium, tantalum, tantalum nitride, titanium nitride, molybdenum, tungsten, cobalt, or a combination thereof. A planarization process, e.g., CMP, is then performed to polish the surface of the dielectric layer 204.

Figure 3:
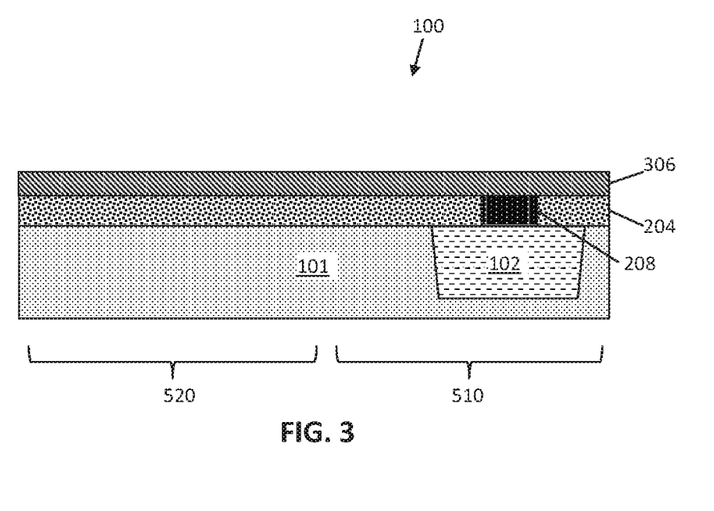
FIG. 3 depicts a cross-sectional side view of the semiconductor device subsequent to depositing a first electrode (bottom electrode) on the metal connector.

FIG. 3 depicts a cross-sectional side view of the semiconductor device 100 subsequent to depositing a first electrode 306 on the metal connector 208. The first electrode 306 is deposited on the entire substrate, including the first area 510 and the second area 520. In embodiments of the invention in which the metal connector is not included, the first electrode 306 is deposited directly on the metal interconnect 102 arranged in the dielectric layer 101. Non-limiting examples of materials for the first electrode 306 (also referred to as a bottom electrode) include metals, for example, platinum, copper, silver, gold, ruthenium, iridium, nickel, titanium, titanium nitride, tantalum, tantalum nitride, zirconium nitride, or a combination thereof. The thickness of the first electrode 306 is typically less than 40 nm, so that the underlying metal structures (metal interconnect 102 or metal connector 208) are readable in subsequent lithography exposure of the alignment assisting component/alignment mark (see FIG. 5).

Figure 4:
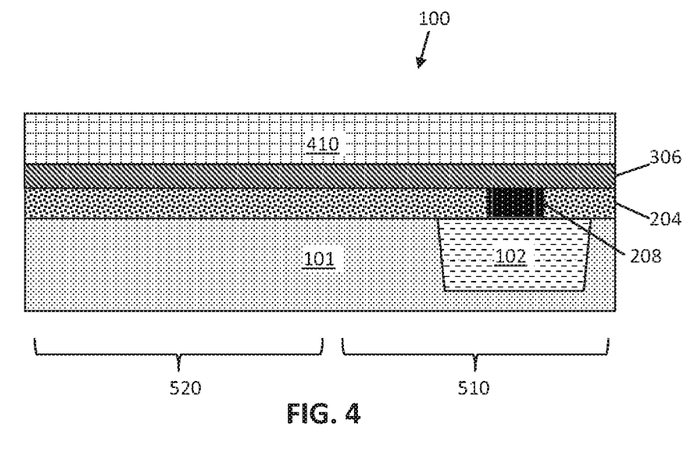
FIG. 4 depicts a cross-sectional side view of the semiconductor device subsequent to depositing a film on the bottom electrode.

FIG. 4 depicts a cross-sectional side view of the semiconductor device 100 subsequent to depositing a film 410 on the first electrode 306. The film 410 will be used to form the alignment assisting marker/component (see FIG. 5). According to one or more embodiments of the invention, the film 410 includes a material with desirable etch selectivity against the first electrode 306. The thickness of the film 410 is not intended to be limited. Yet, according to some embodiments of the invention, the thickness of the film 410 is about 5 to about 200 nanometers (nm), or about 20 to about 50 nm in other embodiments. Non-limiting examples of materials for the film 410 include silicon dioxide, silicon nitride, silicon oxynitride, carbon-doped silicon oxide (SiCOH), silicon carbonitride, spin-on-glass, aluminum oxide, polymers such as parylene, crosslinked polyphenylenes, poly (arylene ethers), or a combination thereof.

Figure 5:
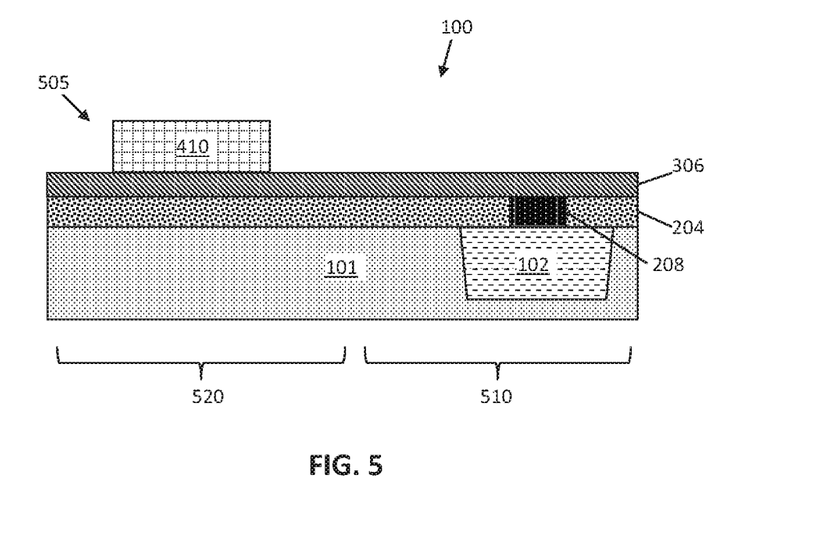
FIG. 5 depicts a cross-sectional side view of the semiconductor device subsequent to etching the film to form an alignment assisting marker.

FIG. 5 depicts a cross-sectional side view of the semiconductor device 100 subsequent to etching the film 410 to form an alignment mark 505 (also referred to as an alignment assisting component). The alignment mark 505 is formed in a second area 520 of the semiconductor device 100 proximate to a first area 510. The alignment mark 505 is patterned with the desired pattern in the second area 520 such that the alignment mark 505 is not arranged over the RRAM area (first area 510). The location of the alignment mark 505 with respect to a reference point is known and can be analyzed and processed by an alignment tool. For example, the reference point can be the center of the photomask. The thickness of the alignment mark 505 is defined by the thickness of the film 410. Lithography and etching and performed to form the alignment mark 505. The lithography definition of the alignment mark 505 can align to underlying layers (metal interconnect 102 or metal connector 208). According to one or more embodiments, a new photomask can be used to pattern and etch the film 410 to form the alignment mark 505. According to some other embodiments, alignment chips can be used with an existing mask used in the subsequent process flow. For example, the photomask of the very last level in the process flow can be used to print several chips on the wafer, and alignment marks on those several chips are sampled for alignment during subsequent lithography.

Figure 6:
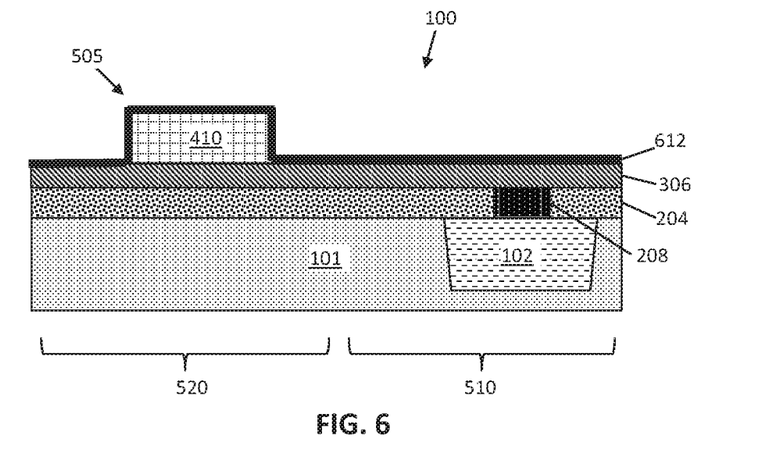
FIG. 6 depicts a cross-sectional side view of the semiconductor device subsequent to depositing a dielectric layer on the bottom electrode as well as on the alignment assisting marker.

FIG. 6 depicts a cross-sectional side view of the semiconductor device 100 subsequent to depositing a dielectric layer 612 on the entire substrate, including the alignment mark 505 formed from the film 410 in the second area 520, and on the metal interconnect 102 in the first area 510. The dielectric layer 612 can include, but is not limited to, a transition metal oxide, for example, hafnium oxide, titanium oxide, zirconium oxide, tantalum oxide, molybdenum oxide, zinc oxide, nickel oxide, cerium oxide, lanthanum oxide, or a combination thereof. The dielectric layer 612 can also include materials doped with metals, for example, silver-doped titanium oxide, silver-doped amorphous silicon, silver-doped poly(n-vinylcarbazole), etc. The dielectric layer 612 covers the alignment assisting marker 505 and the first electrode 306, with the alignment assisting marker being arranged between the first electrode 306 and the dielectric layer 612.

In one or more embodiments of the invention, dielectric layer 612 is deposited directly after formation of alignment mark 505. In another embodiment, additional film of first electrode 306 is deposited on the entire substrate, including the alignment mark 505, followed by depositing a dielectric layer 612.

Figure 7:
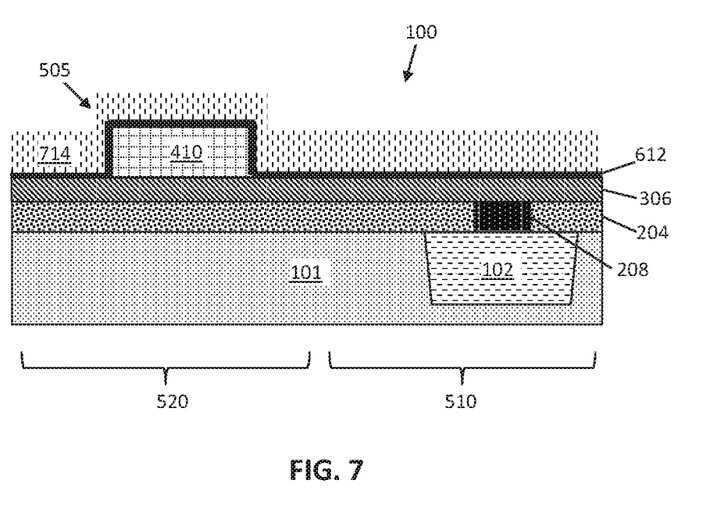
FIG. 7 depicts a cross-sectional side view of the semiconductor device subsequent to depositing a second electrode (top electrode) on the dielectric layer.

FIG. 7 depicts a cross-sectional side view of the semiconductor device 100 subsequent to depositing a second electrode 714 on the dielectric layer 612. Non-limiting examples of materials for the top electrode 714 (also referred to as a top electrode) include metals, for example, platinum, copper, silver, gold, ruthenium, iridium, nickel, titanium, titanium nitride, tantalum, tantalum nitride, zirconium nitride, or a combination thereof. The second electrode 714 and the first electrode 306 can be same metal, or different metal.

Figure 8:
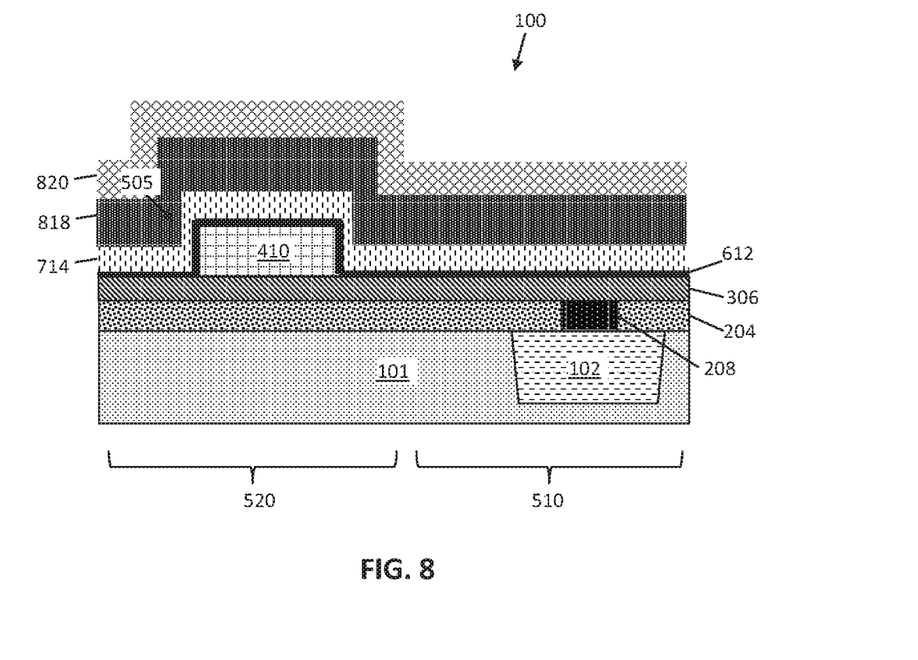
FIG. 8 depicts a cross-sectional side view of the semiconductor device subsequent to depositing a metal connector layer and a hard mask layer on the top electrode.

FIG. 8 depicts a cross-sectional side view of the semiconductor device 100 subsequent to depositing a metal connector layer 818 and a hard mask layer 820 on the second electrode 714. Non-limiting examples of materials for the metal connector layer 818 include niobium, tantalum, tantalum nitride, titanium nitride, molybdenum, tungsten, cobalt, or a combination thereof. Non-limiting examples of materials for the hard mask layer 820 include silicon oxide, silicon nitride, silicon oxynitride, silicon carbonitride, spin-on-glass or a combination thereof. The hard mask layer 820 serves as a sacrificial layer that protects the metal connector layer 818 and the RRAM stack 1001 in subsequent etch processes (see FIG. 10). In one or more embodiments of the invention, the hard mask layer 820 is partially consumed during reactive-ion-etch (ME) of RRAM stack, and then excess hard mask layer 820 is removed by a wet process. In other embodiment of the invention, the hard mask layer 820 is completely consumed during the aforementioned RIE. In yet other embodiments of the invention, both the hard mask layer 820 and part of the metal connector layer 818 is consumed during the RIE. The alignment mark 505 creates a raised topography in the overlaying layers, including the dielectric layer 612, top electrode 714, metal connector layer 818, and hard mask layer 820. The topography transfers the alignment mark position up through the opaque metal layers (metal connector layer 818 and second electrode 714), and therefore the alignment mark 505 provides the equivalent position of underlying alignment mark at film 410. Without the alignment mark 505, the opacity of the materials forming the metal connector layer 818, second electrode 714, and first electrode 306 would generally prevent proper alignment to the metal interconnect 102 beneath, as these materials include metals that are opaque.

The alignment marks/alignment assisting components described in this invention are not limited to scanner alignment marks. By placing multiple marks/components in different shapes and meeting the specifications of different purposes/tools, the alignment mark/alignment assisting component can serve as overlay marks for overlay metrology, alignment marks for CDSEM (Critical Dimension Scanning Electron Microscope), alignment marks for defect inspection tools, etc.

Figure 9:
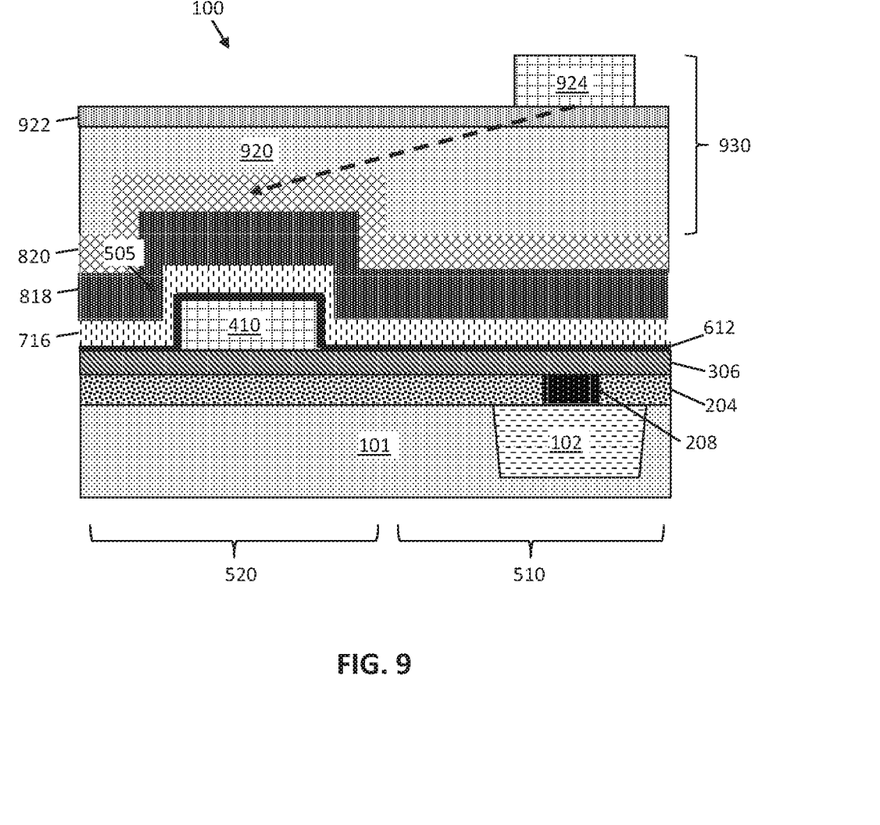
FIG. 9 depicts a cross-sectional side view of the semiconductor device subsequent to depositing a resist stack on the hard mask layer.

FIG. 9 depicts a cross-sectional side view of the semiconductor device 100 subsequent to depositing a resist stack 930 on the hard mask layer 820. The resist stack 930 can include, for example, a planarization layer 920 (e.g., an organic planarization layer (OPL) or other spin-on polymeric coating), an anti-reflective layer 922, and a resist 924 (e.g., a photoresist); although, the resist stack 930 is not limited to these layers and materials. The resist 924 can be patterned by lithographic exposure. The pattern formed by the resist 924 will be transferred through the layers beneath to form the RRAM memory stack over the metal interconnect 102 in the first area 510. The resist 924 is aligned to the alignment mark 505 through the raised topography created at the hard mask layer 820, as the layers of the resist stack 930 (planarization layer 920 and anti-reflective layer 922) are transparent.

Figure 10:
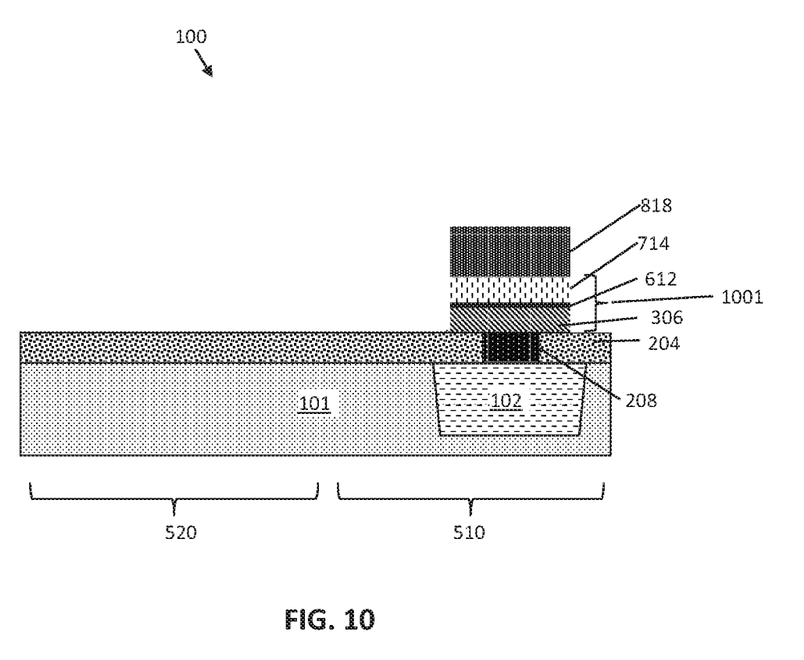
FIG. 10 depicts a cross-sectional side view of the semiconductor device subsequent to etching to form a memory stack.

FIG. 10 depicts a cross-sectional side view of the semiconductor device 100 subsequent to etching to form a memory stack 1001 (e.g., an RRAM stack). The resist stack 930 and hard mask layer 820 are either consumed during the etching process, or subsequently removed. Portions of the metal connector layer 818, second electrode 714, dielectric layer 612, and first electrode 306 are removed by transferring the pattern of the resist 924 into the layers beneath. An encapsulating dielectric layer (not shown) can be deposited on the memory stack 1001. The encapsulating dielectric layer can deposited using a deposition process, for example, CVD or PVD. Non-limiting examples of materials for the encapsulating dielectric layer include dielectric oxides (e.g., silicon dioxide), dielectric nitrides (e.g., $Si_xN_y$), dielectric oxynitrides (e.g., $SiO_xN_y$), or any combination thereof.

Figure 11:
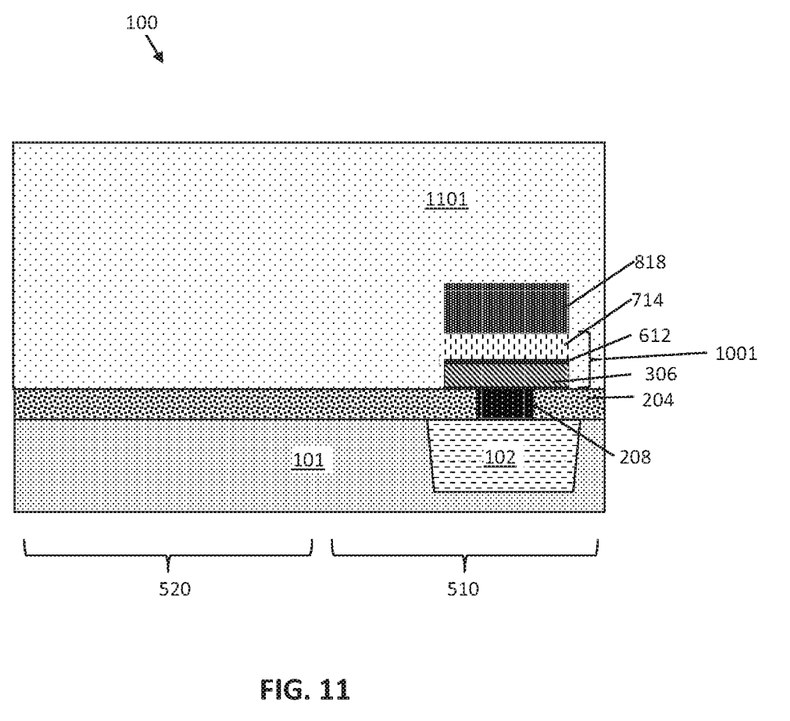
FIG. 11 depicts a cross-sectional side view of the semiconductor device subsequent to depositing an interlayer dielectric on the memory stack.

FIG. 11 depicts a cross-sectional side view of the semiconductor device 100 subsequent to depositing an interlayer dielectric 1101 on the memory stack 1001. The interlayer dielectric 1101 can include a low-k dielectric, including but not limited to, silicon dioxide, spin-on-glass, a flowable oxide, a high-density plasma oxide, carbon-doped silicon oxide (SiCOH), silicon carbonitride, polymers such as parylene, crosslinked polyphenylenes, poly(arylene ethers), or any combination thereof.

Figure 12:
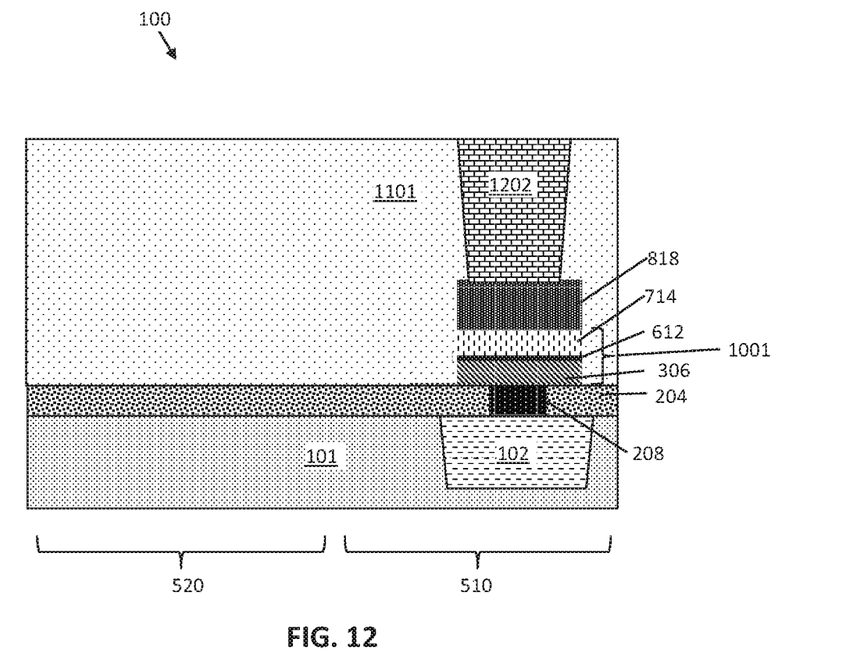
FIG. 12 depicts a cross-sectional side view of the semiconductor device subsequent to forming a metal via to connect the memory device to the metal layer above.

FIG. 12 depicts a cross-sectional side view of the semiconductor device 100 subsequent to forming a metal interconnect 1202 to connect the memory device (the memory stack 1001) to other devices/circuits (not shown). The metal interconnect 1202 can be a single metal trench, or a combined metal/via trench. To form the metal layer 1202 (or contact), a trench is etched through the interlayer dielectric 1101 then filled with a metal(s). The interlayer dielectric 110 can be etched, for example, using a wet etch chemical process. A metallization process is employed to deposit a metal into the trench and form the contact. The metal can be deposited by performing a deposition process, for example, CVD, PECVD, PVD, plating, thermal or e-beam evaporation, or sputtering. Non-limiting examples of materials for the metal include copper, copper alloys, aluminum, aluminum alloys, tungsten, tungsten silicide, cobalt, molybdenum, titanium nitride, tantalum, tantalum nitride, or any combination thereof.

The method of inserting alignment marks after the first electrode deposition described in this invention is not limited to RRAM stacks, but extendable to other devices with metal/insulator/metal (MIM) structure. For example, for an exemplary PCRAM (Phase Change Random Access Memory) stack TiN top electrode/$Ge_2Sb_2Te_5$ (GST)/W bottom electrode, the alignment mark can be inserted after the deposition of W bottom electrode, followed by deposition of GST, or additional W, then GST.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a first area comprising a memory stack area;
   a second area comprising an alignment mark area;
   a metal interconnect arranged on a substrate in the first area;
   a first electrode layer that is a continuous single layer that extends from the first area to the second area and arranged on the metal interconnect in the first area;
   an alignment assisting marker arranged in the second area, the alignment assisting marker being a raised portion of a film arranged directly on the first electrode layer and on the memory stack area of the first area;
   a dielectric layer and a second electrode layer arranged on the alignment assisting marker in the second area, the dielectric layer arranged directly on the first electrode layer in the first area and extends as a continuous single layer to the second area;
   a hard mask layer arranged on the second electrode area, the hard mask layer providing a raised area of topography over the alignment assisting marker; and
   a resist arranged on the hard mask layer in the first area.

2. The semiconductor device of claim 1, wherein the first electrode layer comprises a metal.

3. The semiconductor device of claim 2, wherein the second electrode layer comprises a metal.

4. The semiconductor device of claim 1, wherein the first electrode layer comprises platinum, copper, silver, gold, ruthenium, iridium, nickel, titanium, titanium nitride, tantalum, tantalum nitride, zirconium nitride, or a combination thereof.

5. The semiconductor device of claim 1, wherein the second electrode layer comprises platinum, copper, silver, gold, ruthenium, iridium, nickel, titanium, titanium nitride, tantalum, tantalum nitride, zirconium nitride, or a combination thereof.

6. The semiconductor device of claim 1, wherein the film of the alignment assisting marker is a non-metallic material.

7. The semiconductor device of claim 1, wherein the film of the alignment assisting marker has an etch selectivity against the first electrode layer.

8. The semiconductor device of claim 1, wherein the film of the alignment assisting marker has a thickness of about 5 to about 200 nanometers (nm).

9. The semiconductor device of claim 1, wherein the film of the alignment assisting marker is silicon dioxide, silicon nitride, silicon oxynitride, carbon-doped silicon oxide (Si-COH), silicon carbonitride, spin-on-glass, aluminum oxide, polymers such as parylene, crosslinked polyphenylenes, poly(arylene ethers), or a combination thereof.

10. The semiconductor device of claim 1, wherein the resist comprises a planarization layer, an anti-reflective coating, and a resist layer.

* * * * *